(12) United States Patent
Cho et al.

(10) Patent No.: US 8,947,165 B2
(45) Date of Patent: Feb. 3, 2015

(54) MULTI-MODE DOHERTY POWER AMPLIFIER

(71) Applicant: Postech Academy-Industry Foundation, Pohang-si, Gyungbuk (KR)

(72) Inventors: Yun Sung Cho, Bucheon-si (KR); Bum Man Kim, Pohang-si (KR); Dae Hyun Kang, Pohang-si (KR)

(73) Assignee: Postech Academy-Industry Foundation, Pohang-Si, Gyungbuk (KR)

( * ) Notice: Subject to any disclaimer, the term of this patent is extended or adjusted under 35 U.S.C. 154(b) by 79 days.

(21) Appl. No.: 13/798,188

(22) Filed: Mar. 13, 2013

(65) Prior Publication Data

US 2013/0241657 A1     Sep. 19, 2013

(30) Foreign Application Priority Data

Mar. 14, 2012 (KR) .................... 10-2012-0026289

(51) Int. Cl.
| | | |
|---|---|---|
| *H03F 3/68* | (2006.01) | |
| *H03F 3/21* | (2006.01) | |
| *H03F 1/02* | (2006.01) | |
| *H03F 3/72* | (2006.01) | |
| *H03F 3/60* | (2006.01) | |

(52) U.S. Cl.
CPC ............... *H03F 3/211* (2013.01); *H03F 3/68* (2013.01); *H03F 1/0277* (2013.01); *H03F 1/0288* (2013.01); *H03F 3/72* (2013.01); *H03F 3/602* (2013.01); *H03F 2203/7236* (2013.01); *H03F 2203/7239* (2013.01)

USPC ........................................ 330/295; 330/124 R

(58) Field of Classification Search
CPC ............... H03F 1/36; H03F 1/54; H03F 1/50; H03F 1/20; H03F 1/18; H03F 1/0288; H03F 3/24; H03F 3/60; H03F 3/68; H03F 3/211; H03F 3/601; H03F 3/602; H03F 3/604; H03F 3/605; H03F 3/607; H03F 3/3081; H03F 3/45475; H03F 2200/451; H03F 2200/198
USPC .................... 330/295, 124 R, 84, 286, 53–54
See application file for complete search history.

(56) References Cited

U.S. PATENT DOCUMENTS

| | | | | |
|---|---|---|---|---|
| 8,773,205 B2 * | 7/2014 | Chen et al. | ..................... | 330/295 |
| 2012/0112833 A1 * | 5/2012 | Jeong et al. | ............... | 330/124 R |

FOREIGN PATENT DOCUMENTS

KR    10-2005-0089609    9/2005

* cited by examiner

Primary Examiner — Hieu Nguyen
(74) Attorney, Agent, or Firm — Kile Park Reed & Houtteman PLLC

(57) ABSTRACT

The present invention relates to a Doherty power amplifier in which a new operation mode for accomplishing high efficiency at a lower output power level is added to operation of a conventional Doherty power amplifier, thereby achieving high efficiency at various output power levels of the power amplifier. The multi-mode Doherty power amplifier to which a second power mode is added may be reduced in size so as to be integrated into a chip.

20 Claims, 19 Drawing Sheets

MULTI-MODE DOHERTY POWER AMPLIFIER

BACKGROUND OF THE INVENTION

1. Field of the Invention

The present invention relates to a power amplifier, and particularly, to a radio frequency (RF) power amplifier which is used in portable wireless devices such as smart phone and mobile phone or application devices such as notebook computer using power battery. More particularly, the present invention relates to a Doherty power amplifier in which a new operation mode for accomplishing high efficiency at a lower output power level is added to operation of a conventional Doherty power amplifier, thereby achieving high efficiency at various output power levels of the power amplifier. The multi-mode Doherty power amplifier to which a second power mode is added may be reduced in size so as to be integrated into a chip.

In a general wireless terminal, an RF power amplifier consumes a considerable portion of power used in the entire terminal system. Therefore, the low efficiency of the RF power amplifier degrades the efficiency of the entire system and wastes a battery, thereby reducing a talk time. For this reason, much research has been conducted to increase the efficiency of the RF power amplifier. When the RF power amplifier has higher efficiency, the battery use may be reduced. Accordingly, the talk time may be extended, or the terminal use time based on battery charging may be increased.

For this reason, the research has been focused on increasing the efficiency of the RF power amplifier. Representative examples of the RF power amplifier which has been recently researched may include a Doherty power amplifier and a multi-mode power amplifier.

The Doherty power amplifier has been first proposed by W. H. Doherty in 1936, and connects a carrier amplifier and a peaking amplifier in parallel to each other using a quarter wave transformer ($\lambda/4$ line). A Doherty operation is performed as follows: the Doherty power amplifier changes the amount of current supplied to a load by the peaking amplifier depending on a power level, and controls the load line impedance of the carrier amplifier, thereby increasing efficiency. The multi-mode Doherty power amplifier is configured to operate according to a situation desired by a power amplification stage, and is operated in one mode among various operation modes depending on an output power level.

The Doherty power amplifier configured by adding the multi-power mode characteristics to the conventional Doherty power amplifier may accomplish high efficiency at a lower output power level than in the conventional Doherty power amplifier.

2. Description of the Related Art

The conventional Doherty power amplifier may obtain relatively high power added efficiency at a maximum output point when ideally operating. Furthermore, when the power level is around 6 dB backoff from the maximum output power, the conventional Doherty power amplifier obtain power added efficiency similar to the power added efficiency obtained at the maximum output power. FIG. 1 illustrates power added efficiency (PAE) curves of a conventional ideal Doherty power amplifier and an ideal class-AB power amplifier, and PAE is defined by the following equation:

PAE=((Pout−Pin)/Pdc).

The size ratio of the carrier amplifier to the peaking amplifier may be changed to adjust a backoff power point at which relatively high power added efficiency may be obtained.

The multi-mode power amplifier is configured to operate according to a situation desired by the power amplifier stage. Furthermore, the multi-mode power amplifier is operated in one mode of various operation modes depending on an output power level. FIG. 2 is a graph illustrating power added efficiency of the conventional multi-mode power amplifier.

FIG. 3 illustrates a conventional Doherty power amplifier integrated into a chip. FIG. 4 illustrates a specific embodiment of a conventional Doherty power amplifier integrated into a chip. FIG. 5 illustrates a conventional multi-mode power amplifier having a dual-path structure, which uses a switch.

FIG. 6 illustrates a conventional multi-power mode amplifier having a dual-path structure, which does not use a switch. Referring to FIGS. 5 and 6, a power stage required for a second power mode and a power stage required for a first power mode are connected in parallel to each other. That is, FIGS. 5 and 6 illustrate a dual-path structure capable of selecting a path depending on a required power mode. FIG. 7 illustrates a conventional multi-mode power amplifier having a bypass structure, which uses a switch.

FIG. 8 illustrates a conventional multi-mode power amplifier having a bypass structure, which does not use a switch. FIGS. 7 and 8 illustrate a bypass structure capable of bypassing or passing through the maximum power stage without an additional power stage.

The conventional multi-mode power amplifier having a bypass or dual-path structure uses a serial switch to select a path of the power mode. The serial switch must have a size enough to accept the maximum power, in order to transmit large power generated from the power stage to the final output stage. Furthermore, since the switch has a specific loss, a loss caused by a switching operation causes an output power reduction. The reduction may degrade the efficiency of the multi-mode power amplifier.

Korean Patent Laid-Open Publication No. 10-2004-0015107 discloses a bypass multi-mode power amplifier using impedance conversion without using a serial switch. The bypass multi-mode power amplifier uses a combination of one or more passive elements such as capacitors or inductors, in order to implement an impedance converter. Even the passive elements used to implement the impedance converter have a specific loss, even though the loss is smaller than in the serial switch. The loss may cause efficiency reduction.

FIG. 9 is a graph illustrating power added efficiency of the conventional ideal Doherty power amplifier and the conventional multi-mode power amplifier.

The conventional Doherty power amplifier may have relatively high efficiency around a backoff operation point about 6 dB by adjusting load line impedance which is the characteristic of the Doherty power amplifier. However, around a backoff operation point of about 10 dB or more, the conventional Doherty power amplifier has lower power added efficiency than in the conventional multi-mode power amplifier.

SUMMARY OF THE INVENTION

Accordingly, the present invention has been made in an effort to solve the problems occurring in the related art, and an object of the present invention is to provide a multi-mode Doherty power amplifier which is capable of accomplishing relatively high efficiency in a backoff operation region of about 6 dB corresponding to an advantage of a Doherty power amplifier and accomplishing relatively high efficiency in a backoff operation region of about 10 dB corresponding to an advantage of a multi-mode power amplifier.

A serial switch or impedance converter required for causing a multi-mode power amplification operation in the conventional multi-mode power amplifier has a power loss.

The impedance converter must be optimized in both of a multi-power mode and a Doherty operation mode so as to obtain power added efficiency. However, the impedance converter capable of performing an optimized operation in all operation modes has difficulties in design. Instead of the serial switch or impedance converter, a switch and a capacitor (switching capacitor unit) connected in parallel are used to minimize a loss, and a simpler structure is applied to implement an optimized operation in both of the multi-power mode and the Doherty operation mode.

In order to achieve the above object, according to one aspect of the present invention, there is provided a multi-mode Doherty power amplifier including: a first input impedance matching unit configured to receive an input voltage through one side thereof; a first power stage having one side connected to an output terminal of the first input impedance matching unit; a first λ/4 impedance control circuit having one side connected to an output terminal of the first power stage; a first impedance matching unit having one side connected to an output terminal of the first λ/4 impedance control circuit; a second power stage having one side connected to an output terminal of the first impedance matching unit; a first harmonic control unit having one side connected to an output terminal of the second power stage; a second λ/4 impedance control circuit commonly connected to the output terminal of the second power stage; a second impedance matching unit commonly connected to the output terminal of the first power stage; a third power stage having one side connected to an output terminal of the second impedance matching unit; a second harmonic control unit having one side connected to an output terminal of the third stage; a second input impedance matching unit commonly connected to the output terminal of the first input impedance matching unit; a fourth power stage having one side connected to an output terminal of the second input impedance matching unit; a switching capacitor unit having one side connected to an output terminal of the fourth power stage and the other side connected to a ground voltage; a third impedance matching unit having one side commonly connected to the output terminal of the fourth power stage and the other side commonly connected to the output terminal of the second power stage; a first output impedance matching unit having one side commonly connected to the output terminals of the second λ/4 impedance control circuit and the third power stage; and a voltage control circuit having control lines connected to the other sides of the first to fourth power stages, respectively, wherein the first output impedance matching unit is configured to transmit an output signal through the other side thereof.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
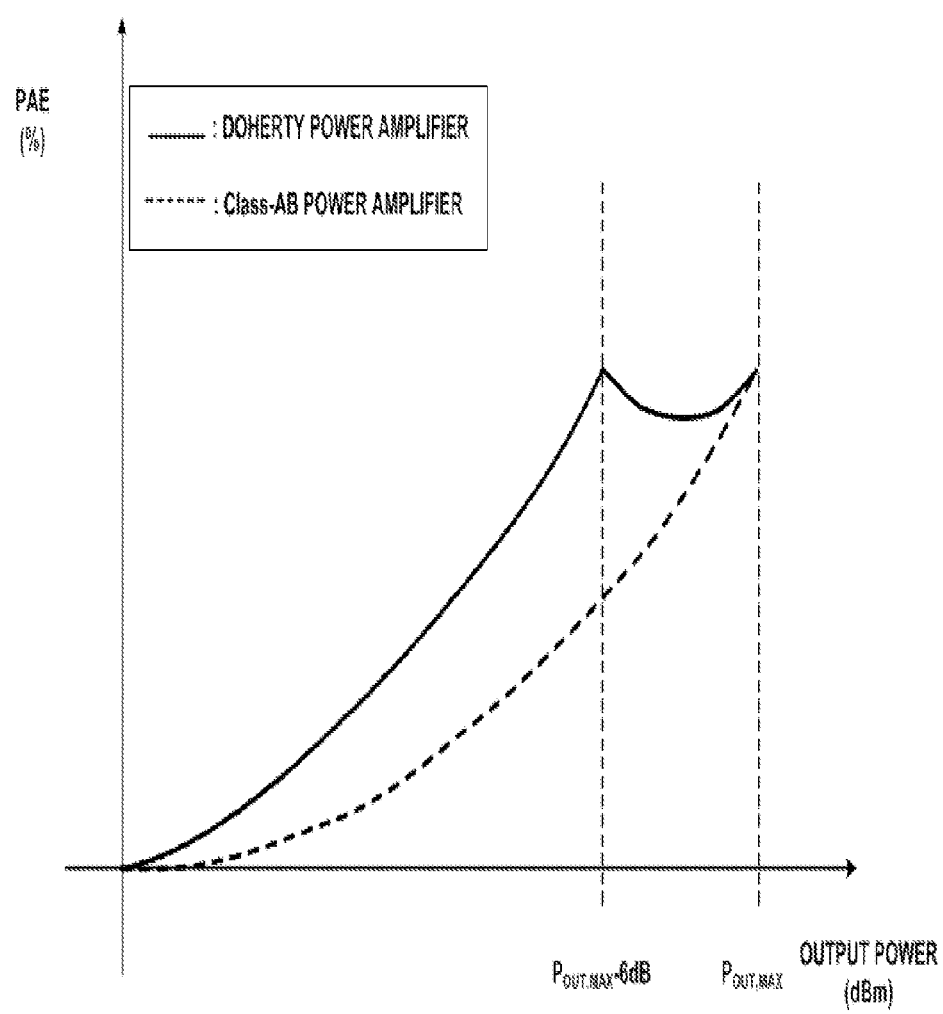
FIG. 1 illustrates power added efficiency curves of a conventional ideal Doherty power amplifier and an ideal class-AB power amplifier.
Figure 2:
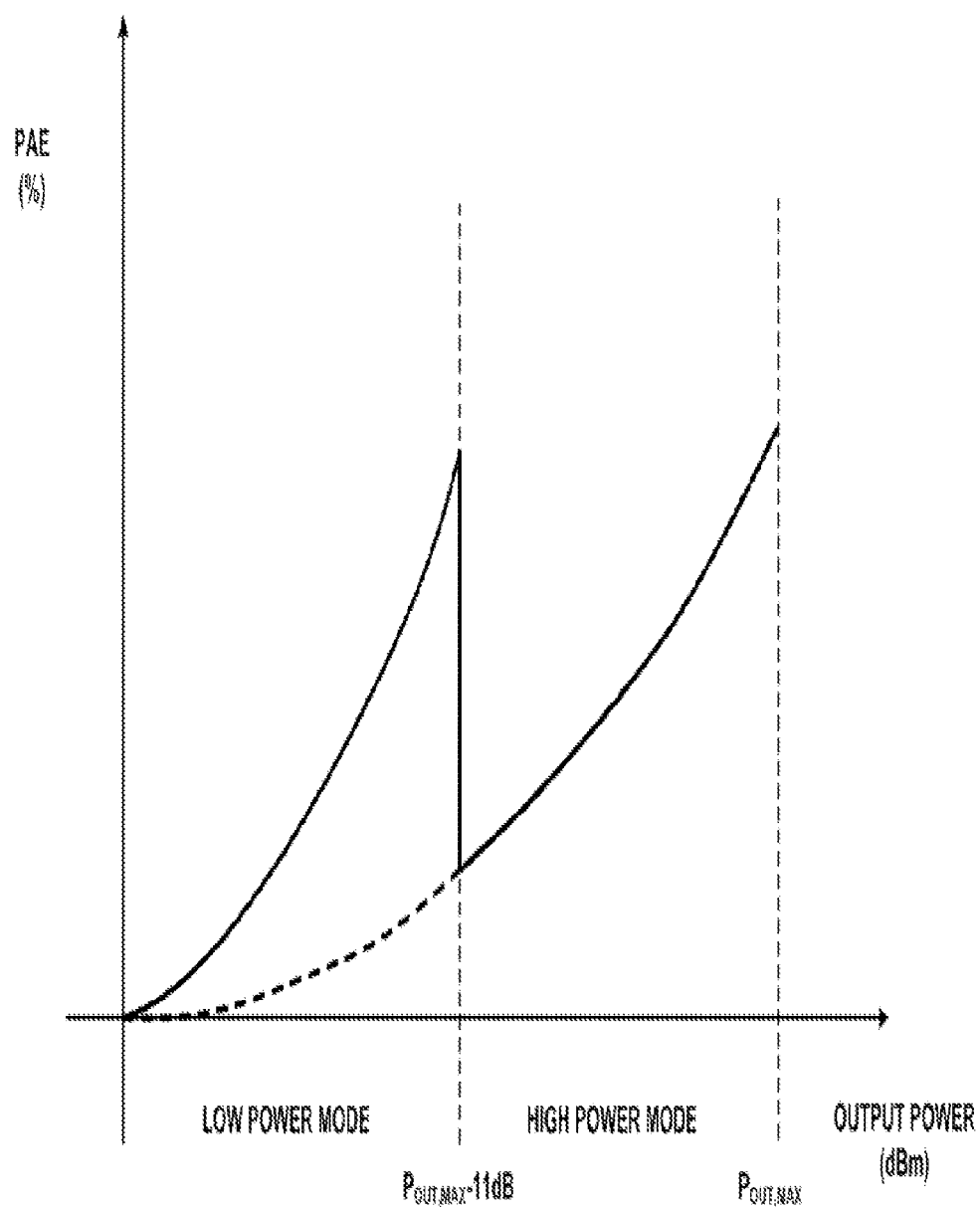
FIG. 2 is a graph illustrating power added efficiency of the conventional multi-mode power amplifier.
Figure 3:
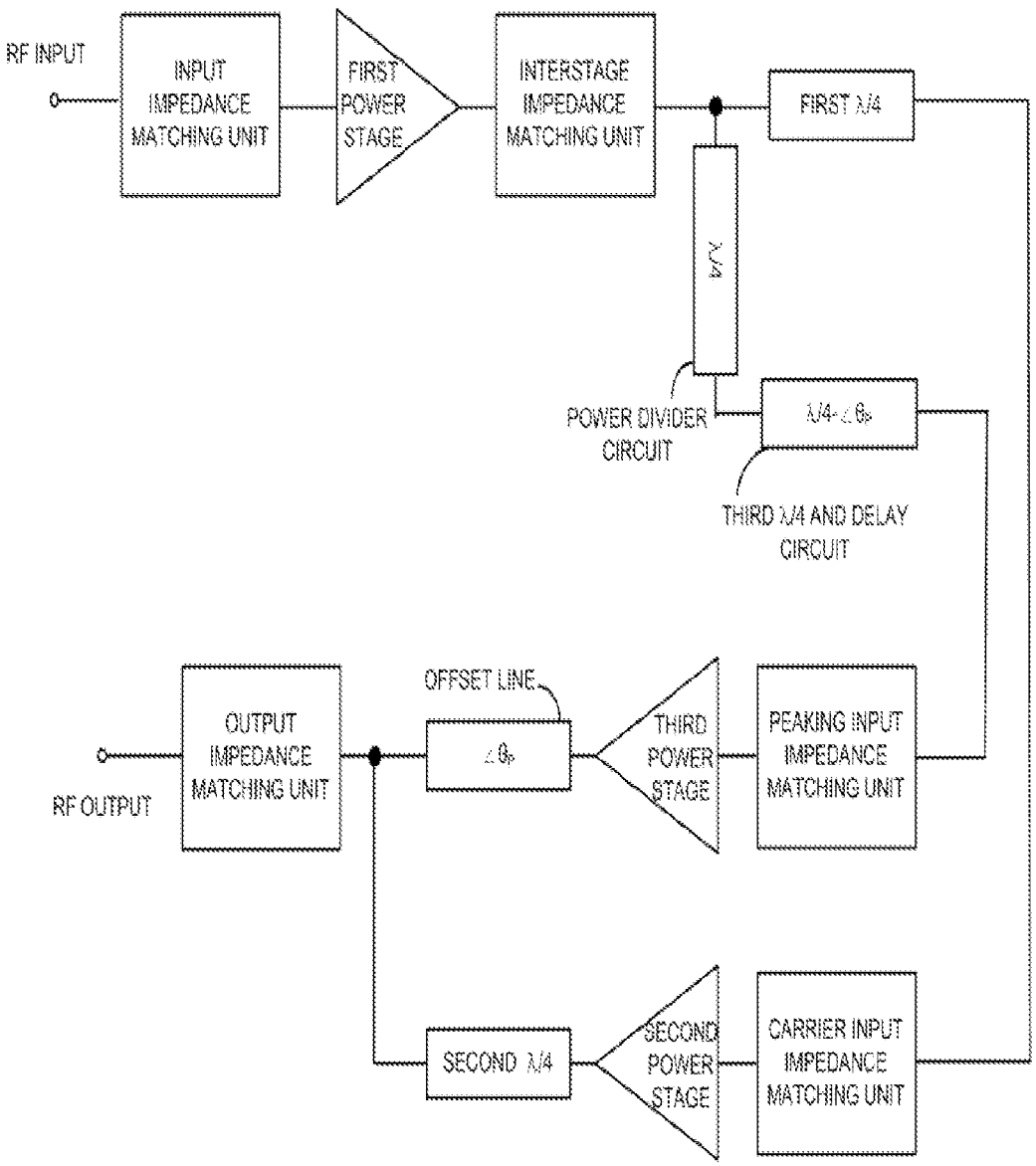
FIG. 3 illustrates a conventional Doherty power amplifier integrated into a chip.
Figure 4:
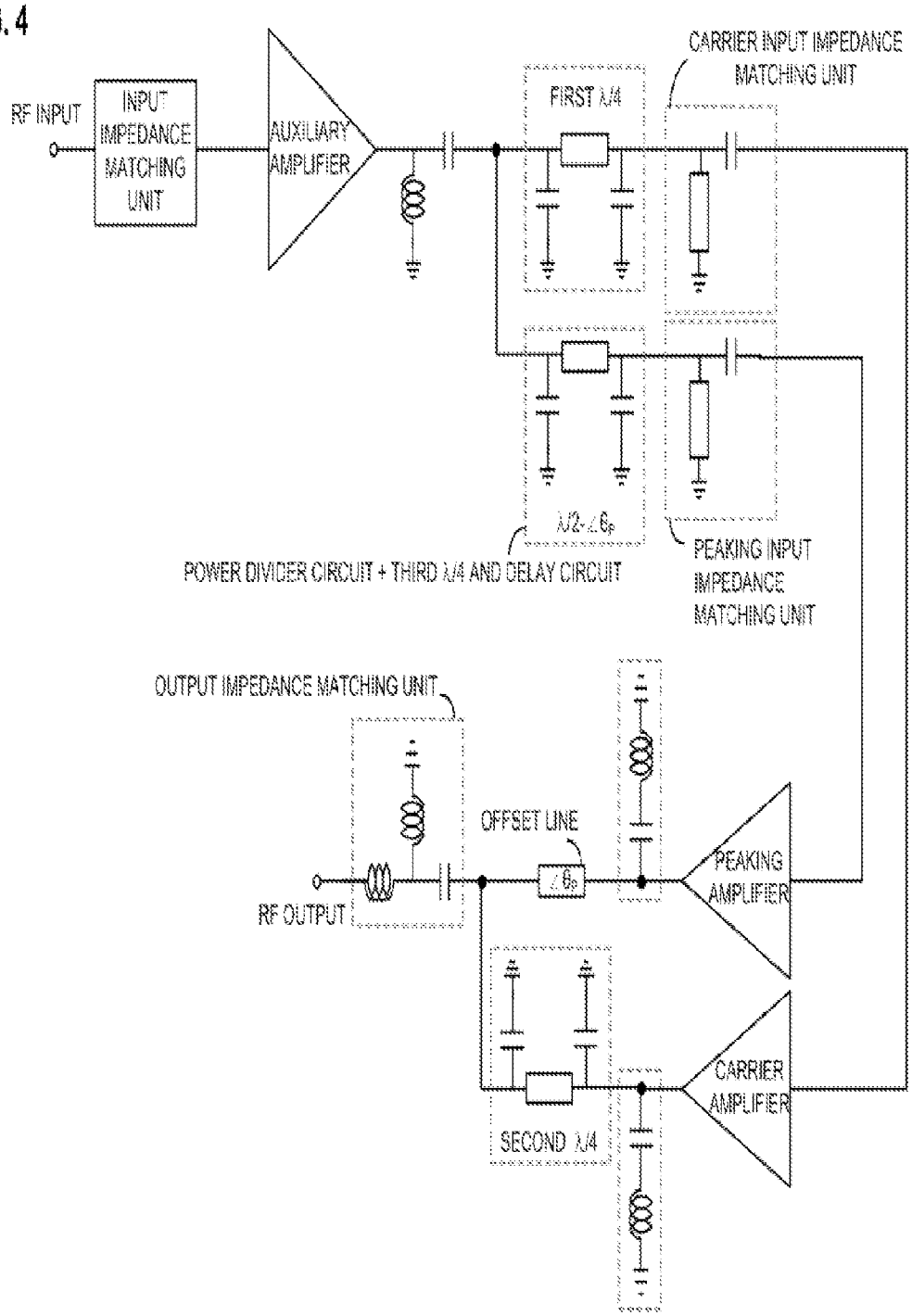
FIG. 4 illustrates a specific embodiment of a conventional Doherty power amplifier integrated into a chip.
Figure 5:
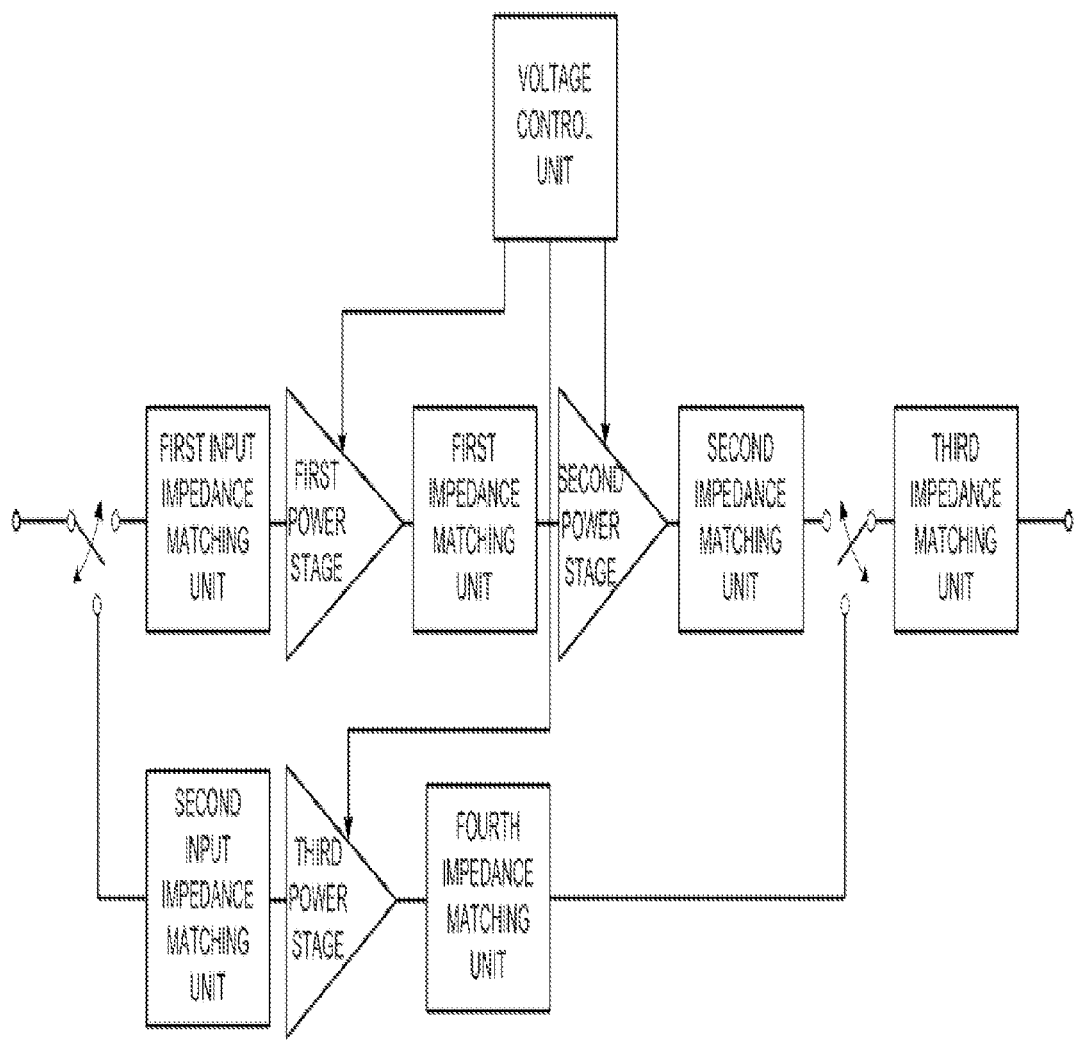
FIG. 5 illustrates a conventional multi-mode power amplifier having a dual-path structure, which uses a switch.
Figure 6:
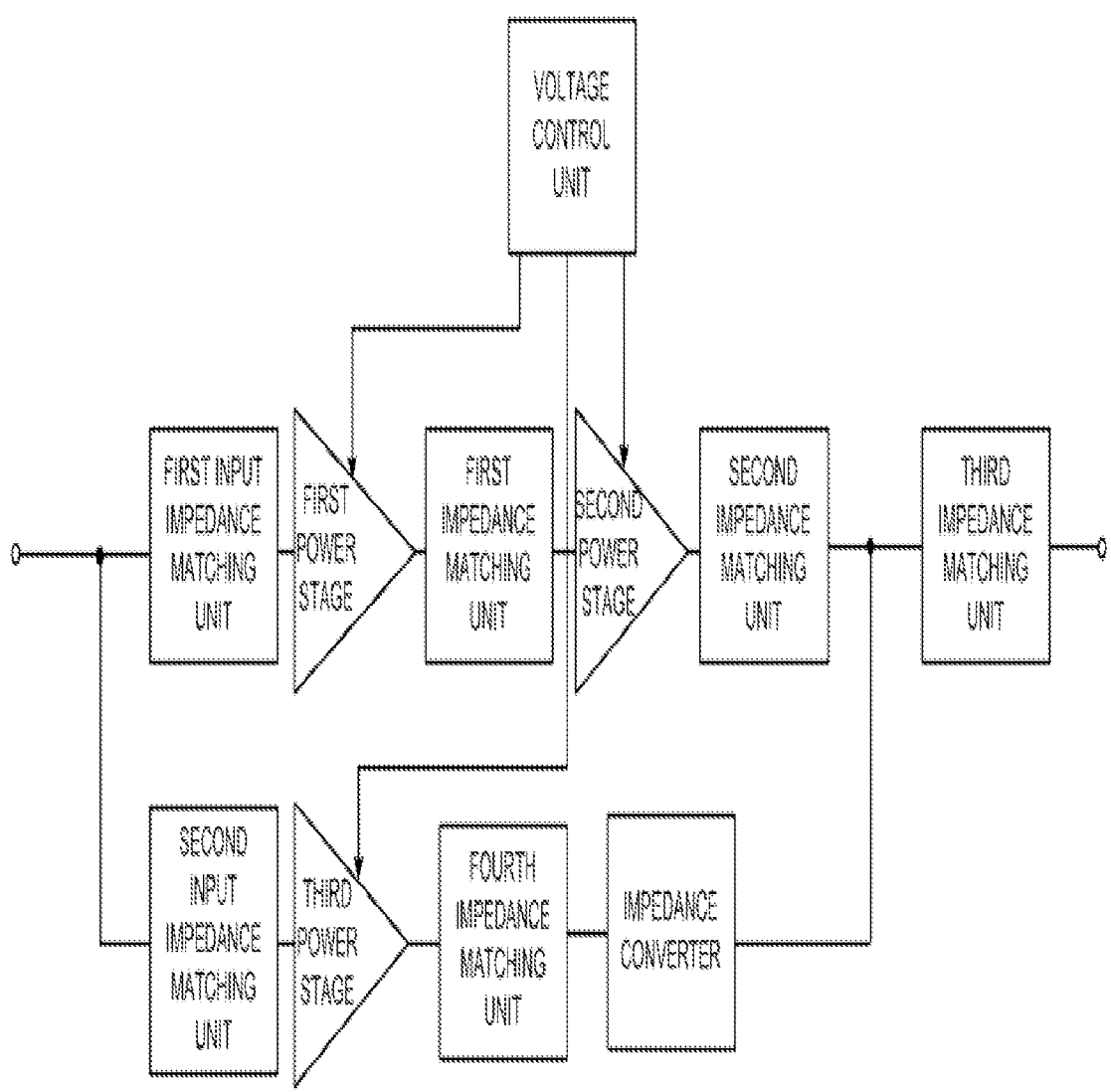
FIG. 6 illustrates a conventional multi-power mode amplifier having a dual-path structure, which does not use a switch.
Figure 7:
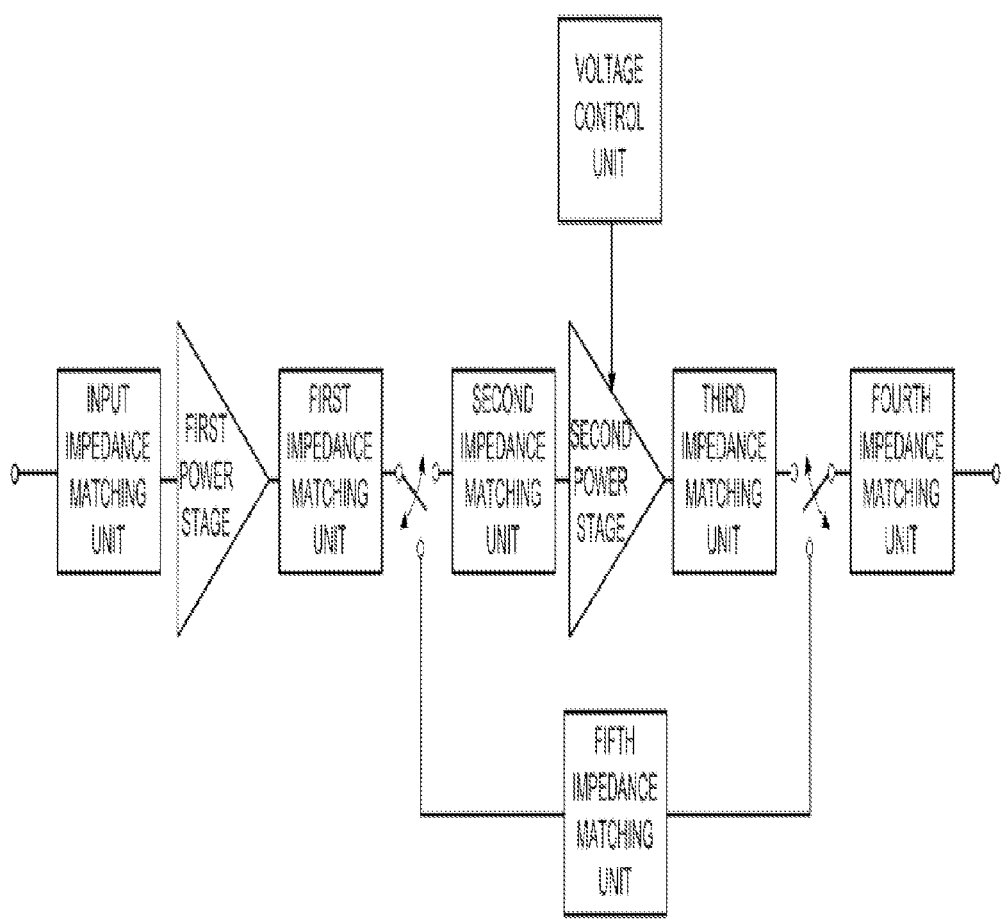
FIG. 7 illustrates a conventional multi-mode power amplifier having a bypass structure, which uses a switch.
Figure 8:
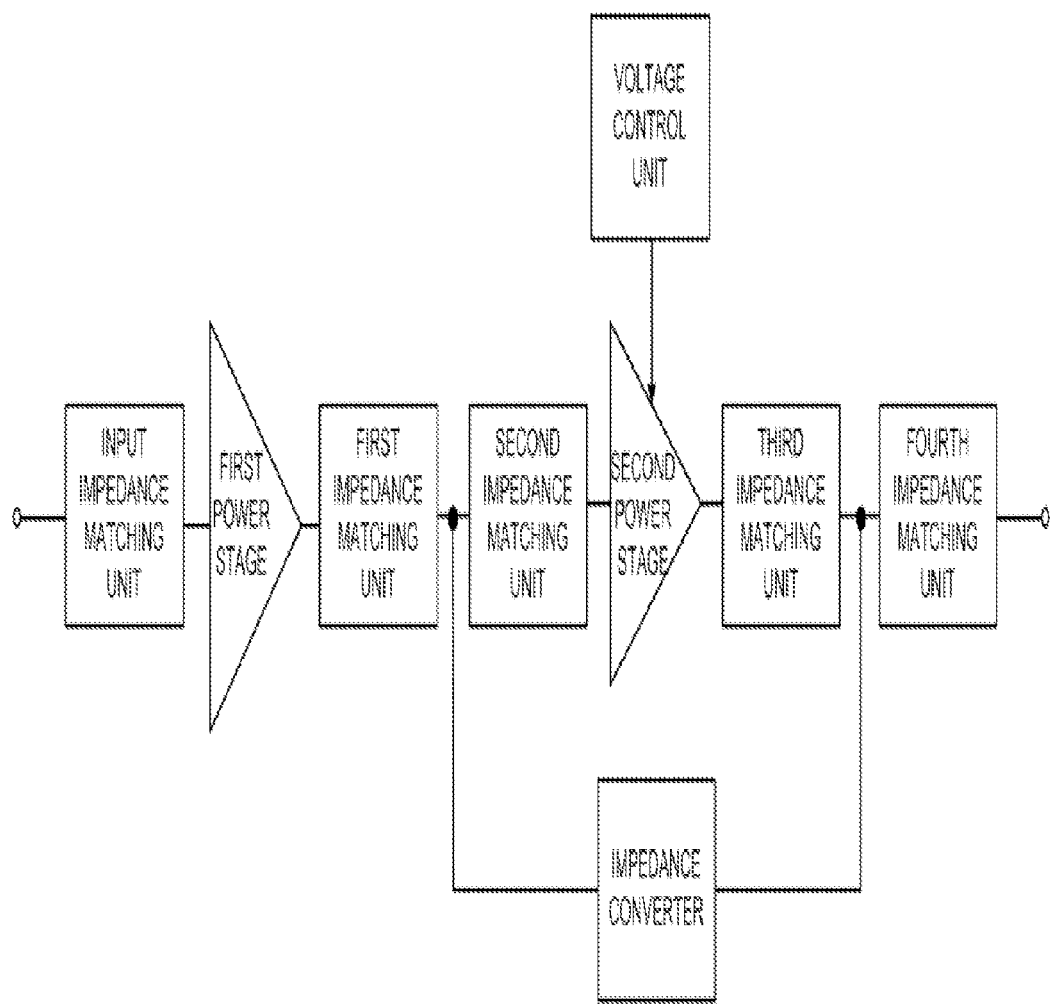
FIG. 8 illustrates a conventional multi-mode power amplifier having a bypass structure, which does not use a switch.
Figure 9:
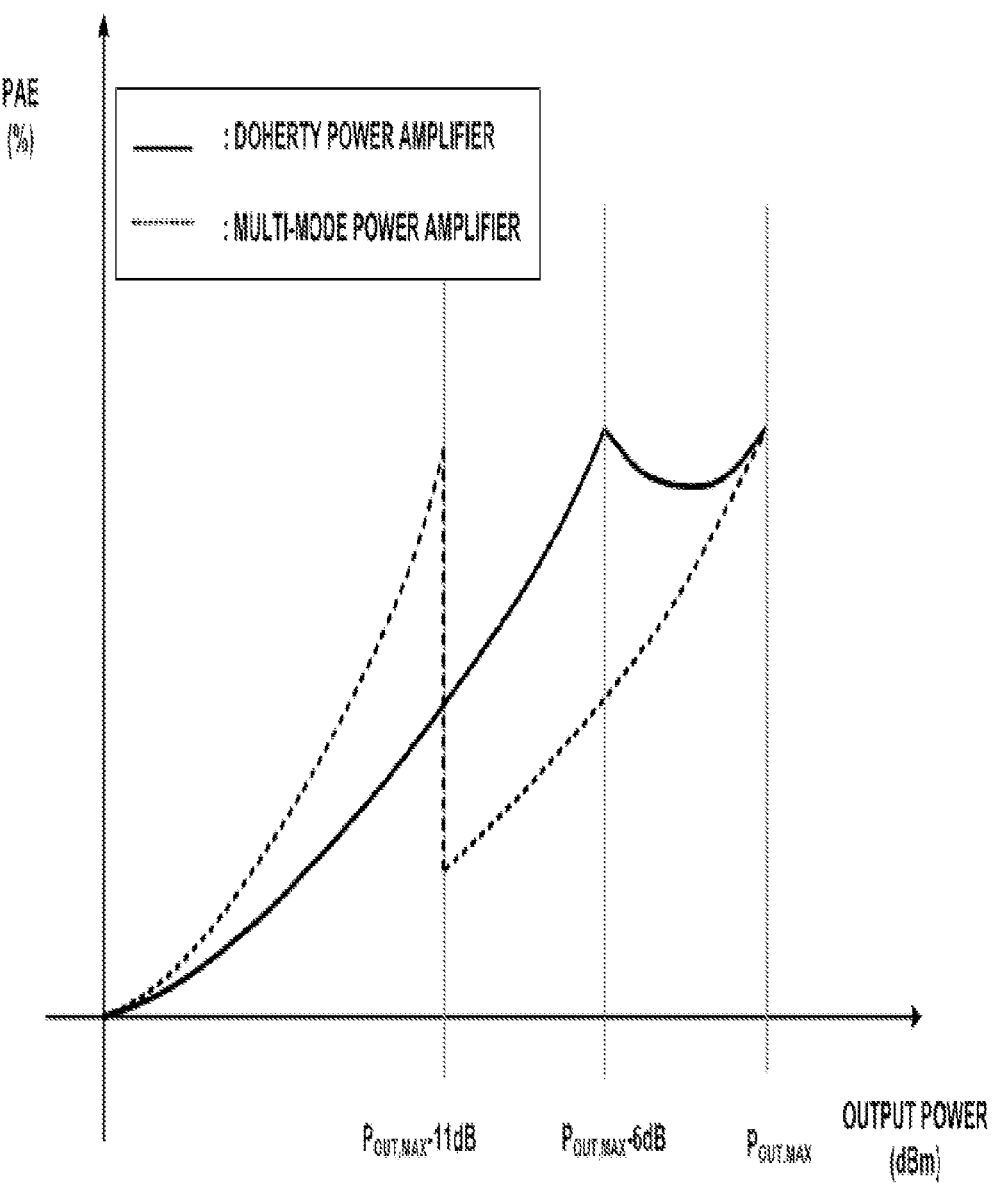
FIG. 9 is a graph illustrating power added efficiency of the conventional ideal Doherty power amplifier and the conventional multi-mode power amplifier.

Reference will now be made in greater detail to a preferred embodiment of the invention, an example of which is illustrated in the accompanying drawings. Wherever possible, the same reference numerals will be used throughout the drawings and the description to refer to the same or like parts.

Figure 10:
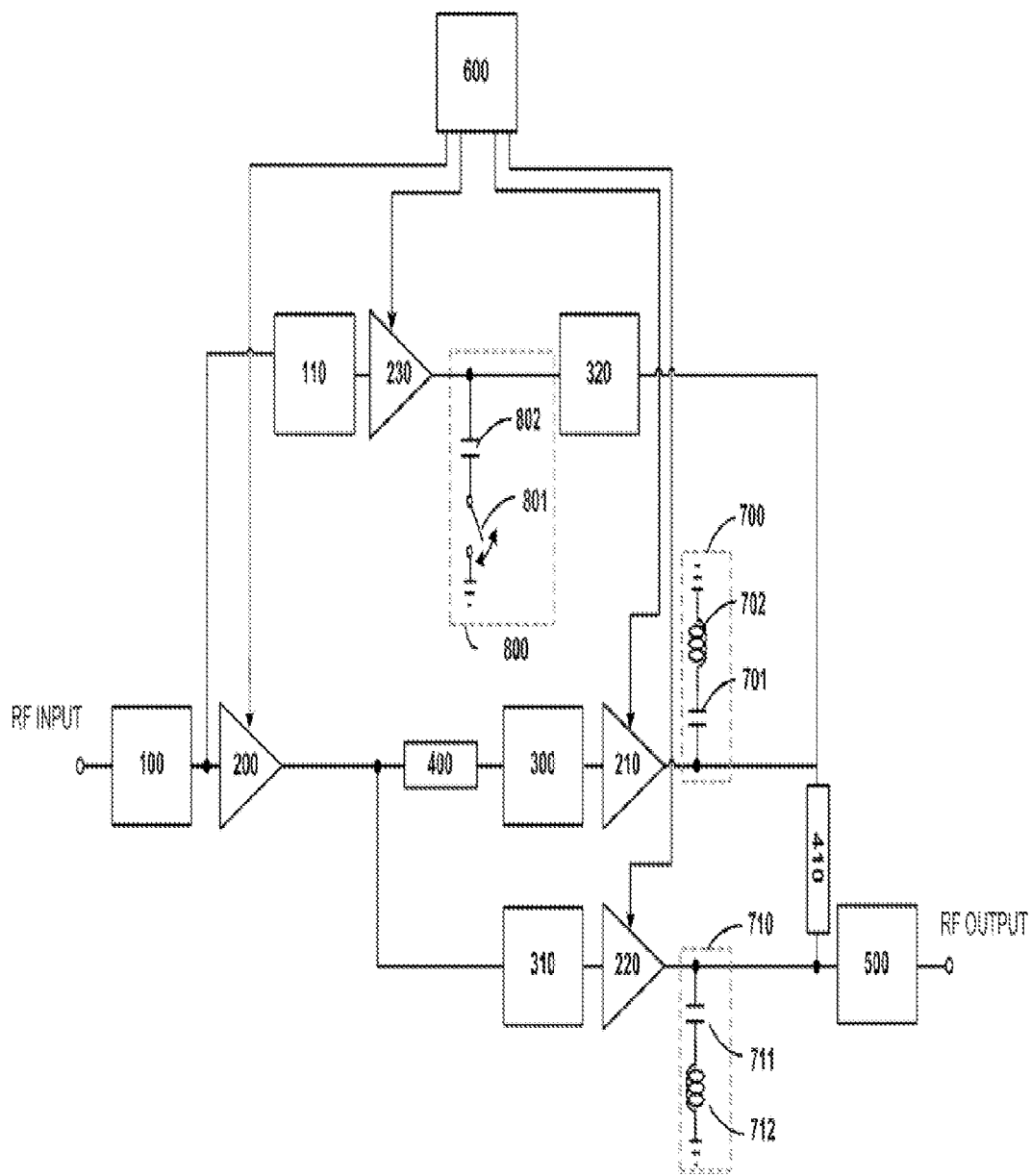
FIG. 10 illustrates a multi-mode Doherty power amplifier having a dual-path structure using a parallel switching capacitor unit in accordance with an embodiment of the present invention.

FIG. 10 illustrates a multi-mode Doherty power amplifier having a dual-path structure using a parallel switching capacitor unit in accordance with an embodiment of the present invention. Referring to FIG. 10, the multi-mode Doherty power amplifier includes a first input impedance matching unit 100 configured to receive an input voltage through one side thereof, a first power stage 200 having one side connected to an output terminal of the first input impedance matching unit 100, a first λ/4 impedance control circuit 400 having one side connected to an output terminal of the first power stage 200, a first impedance matching unit 300 having one side connected to an output terminal of the first λ/4 impedance control circuit 400, a second power stage 210 having one side connected to an output terminal of the first impedance matching unit 300, a first harmonic control unit 700 having one side connected to an output terminal of the second power stage 210, a second λ/4 impedance control circuit 410 having one side connected to the output terminal of the second power stage 210, a second impedance matching unit 310 having one side connected to the output terminal of the first power stage 200, a third power stage 220 having one side connected to an output terminal of the second impedance matching unit 310, a second harmonic control unit 710 having one side connected to an output terminal of the third stage 220, a second input impedance matching unit 110 having one side connected to the output terminal of the first input impedance matching unit 100, a fourth power stage 230 having one side connected to an output terminal of the second input impedance matching unit 110, a switching capacitor unit 800 having one side connected to an output terminal of the fourth power stage 230 and the other side connected to a ground voltage, a third impedance matching unit 320 having one side connected to the output terminal of the fourth power stage 230 and the other side connected to the output terminal of the second power stage 210, a first output impedance matching unit 500 having one side commonly connected to the output terminals of the second λ/4 impedance control circuit 410 and the third power stage 220, and a voltage control circuit 600 having control lines connected to the other sides of the first, second, third, and fourth power stages 200, 210, 220, and 230, respectively. The first output impedance matching unit 500 is configured to transmit an output signal through the other side thereof.

A power stage for a first power mode is configured to perform a Doherty power amplification operation. The power stage for the first power mode is connected in parallel to a power stage for a second power mode. The first power stage 200, the second power stage 210, and the third power stage 220 are operated during the first power mode. The fourth power stage 230 is operated during the second power mode. The parallel switching capacitor unit 800 is positioned at the output connection line of the fourth power stage 230.

During the first power mode, the first and second power stages 200 and 210 is operated in an active state by the voltage control circuit 600, and the fourth power stage 230 is in a cutoff stage.

Figure 11:
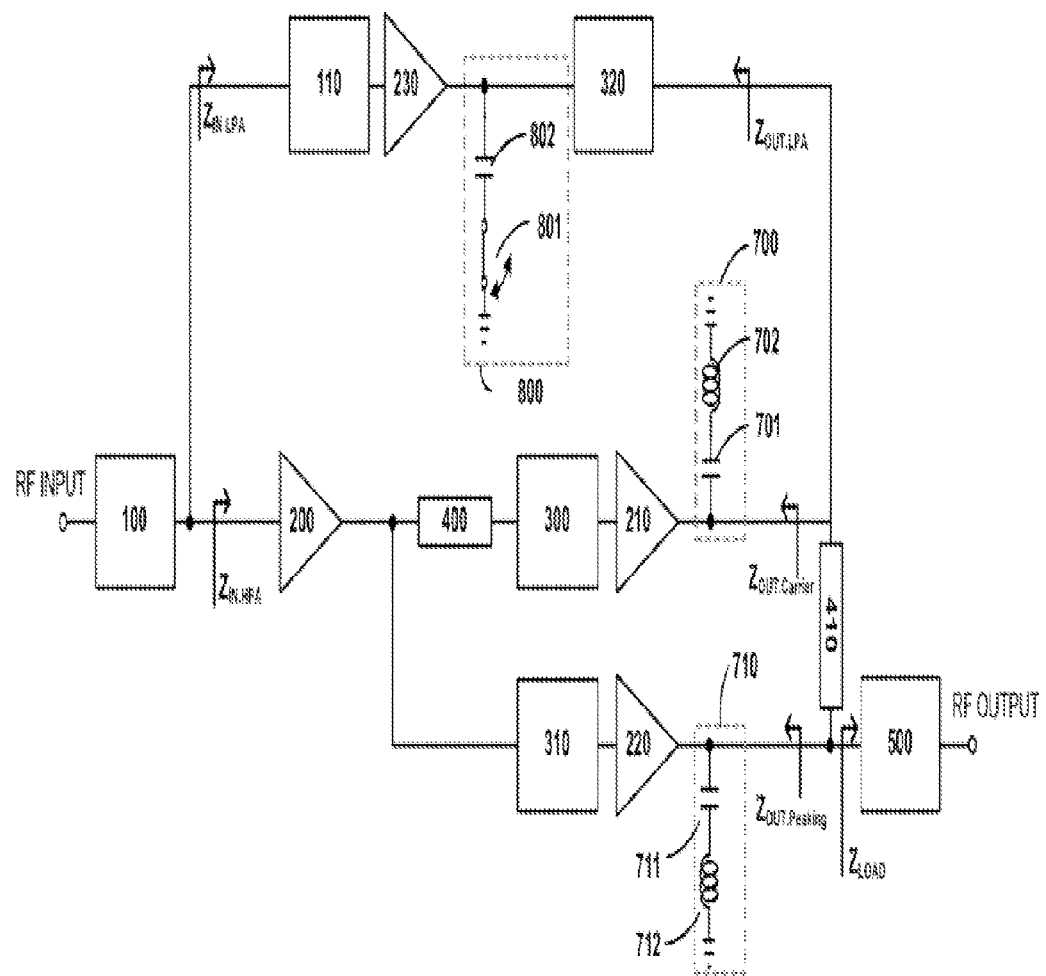
FIG. 11 illustrates an operation example of the multi-mode Doherty power amplifier in accordance with the embodiment of the present invention, during a first power mode.

FIG. 11 illustrates an operation example of the multi-mode Doherty power amplifier in accordance with the embodiment of the present invention, during the first power mode. The third power stage 220 (peaking amplifier) stays in a cutoff state until output power is lower than a backoff power level of 6 dB, according to a bias condition. Then, when the output power exceeds the backoff power level of 6 dB, the third power stage 220 is operated in an active state. The first switch 801 is closed to connect a tenth capacitor 802 and the ground voltage.

During the first power mode, impedance ZIN.LPA in the direction of the second input impedance matching unit 110 from the first input impedance matching unit 100 has a much larger value than impedance ZIN.HPA in the direction of the first power stage 200, thereby minimizing a signal loss in the direction of the second impedance matching unit 110.

In the first power mode, a Doherty operation is performed. The first power mode in which a Doherty operation is performed may be divided into a case in which output power is less than the backoff power level of 6 dB and a case in which the output power is equal to or more than the backoff power level of 6 dB.

When the output power is less than the backoff power level of 6 dB, the third power stage 220 is in a cutoff state, and a signal is outputted through the second power stage 210.

The signal outputted from the second power stage 210 is passed through the second λ/4 impedance control circuit 410 and the first output impedance matching unit 500 and then transmitted to an RF output terminal. Without an additional offset line used in the conventional Doherty power amplifier, output impedance ZOUT.Peaking in the direction of the third power stage 220 has a value close to infinity due to the second harmonic control unit 710 and inductance of a bias line connected to a collector of the third power stage 220, thereby preventing power of the second power stage 210 from leaking to the third power stage 220.

The impedance ZOUT.LPA has a value close to infinity due to the role of the switching capacitor unit 800, thereby preventing the power of the second power stage 210 from leaking to the third impedance matching unit 320.

When the output power is equal to or more than the backoff power level of 6 dB, the third power stage 220 is activated, and the second and third power stages 210 and 220 perform a Doherty operation. Signals outputted from the second and third power stages 210 and 220 are passed through the first output impedance matching unit 500 and then transmitted to the RF output terminal. The impedance ZOUT.LPA has a value close to infinity due to the role of the switching capacitor unit 800, thereby preventing power of the second and third stages 210 and 220 from leaking to the third impedance matching unit 320.

The switching capacitor unit 800 serves to prevent the third impedance matching unit 320 and the fourth power stage 230 from resonating around the operating frequency of the power amplifier. The first switch 801 is connected in parallel. Furthermore, a loss caused by the first switch 801 is insignificant. The reason is that the first switch 801 is not positioned on a path through which a signal is directly transmitted. Since the first switch 801 does not need to handle a large power signal, the first switch 801 may have a smaller size than a transistor used in the conventional amplifier. The tenth capacitor 802 and the first switch 801 of the switching capacitor unit 800 are simply implemented inside a chip through a transistor process. The switching capacitor unit 800 may have a size equal to or less than that of the impedance converter applied to the conventional multi-mode power amplifier which does not use a switch.

Figure 12:
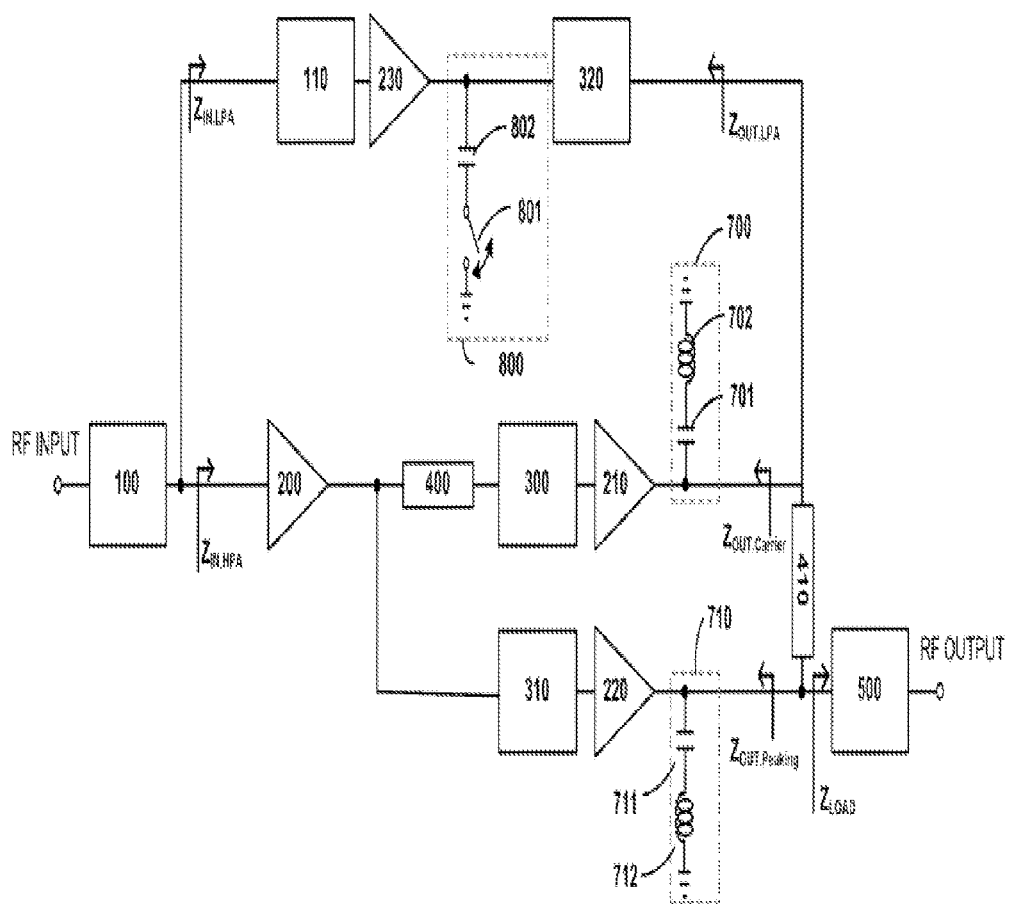
FIG. 12 illustrates an operation example of the multi-mode Doherty power amplifier in accordance with the embodiment of the present invention, during a second mode.

FIG. 12 illustrates an operation example of the multi-mode Doherty power amplifier in accordance with the embodiment of the present invention, during the second mode.

Referring to FIG. 12, during the second power mode, the first power stage 200, the second power stage 210, and the third power stage 220 are in a cutoff state, and the fourth power stage 230 is operated in an active state. The first switch 801 is opened to set the tenth capacitor 802 in an open stub state.

During the second power mode, impedance ZIN.HPA in the direction of the first power stage 200 from the first input impedance matching unit 100 has a larger value than impedance ZIN.LPA in the direction of the second input impedance matching unit 110, thereby minimizing a signal loss in the direction of the first power stage 200.

During the second power mode, output impedance ZOUT.carrier in the direction of the second power stage 210 has a value close to infinity due to the first harmonic control circuit unit 700 and inductance of a bias line connected to a collector of the second power stage 210, thereby preventing power of the fourth power stage 230 from leaking to the second power stage 210.

Furthermore, output impedance ZOUT.Peaking in the direction of the third power stage 220 has a value close to infinity due to the second harmonic control unit 710 and inductance of a bias line connected to a collector of the third power stage 220, thereby preventing power of the fourth power stage 230 from leaking to the third power stage 220. Accordingly, the power of the fourth power stage 230 is transmitted to the RF output terminal through the first output impedance matching unit 500.

Figure 13:
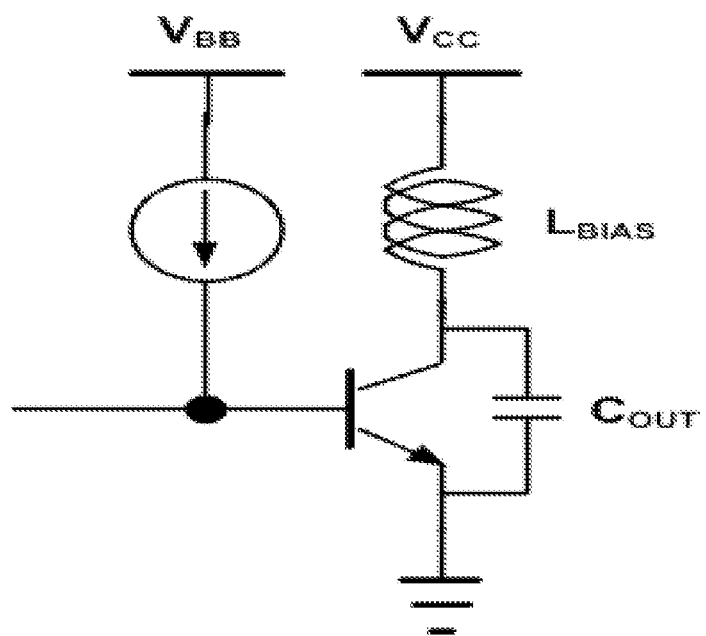
FIG. 13 is a configuration diagram of a first, second, third, or fourth power stage of the multi-mode Doherty power amplifier in accordance with the embodiment of the present invention.

FIG. 13 is a configuration diagram of the first power stage 200, the second power stage 210, the third power stage 220, or the fourth power stage 230 of the multi-mode Doherty power amplifier in accordance with the embodiment of the present invention. In FIG. 13, COUT represents parasitic capacitance formed in an element, VBB represents a base bias voltage which is connected to the voltage control circuit unit, and LBIAS represents inductance of a bias line connected to a collector.

Figure 14:
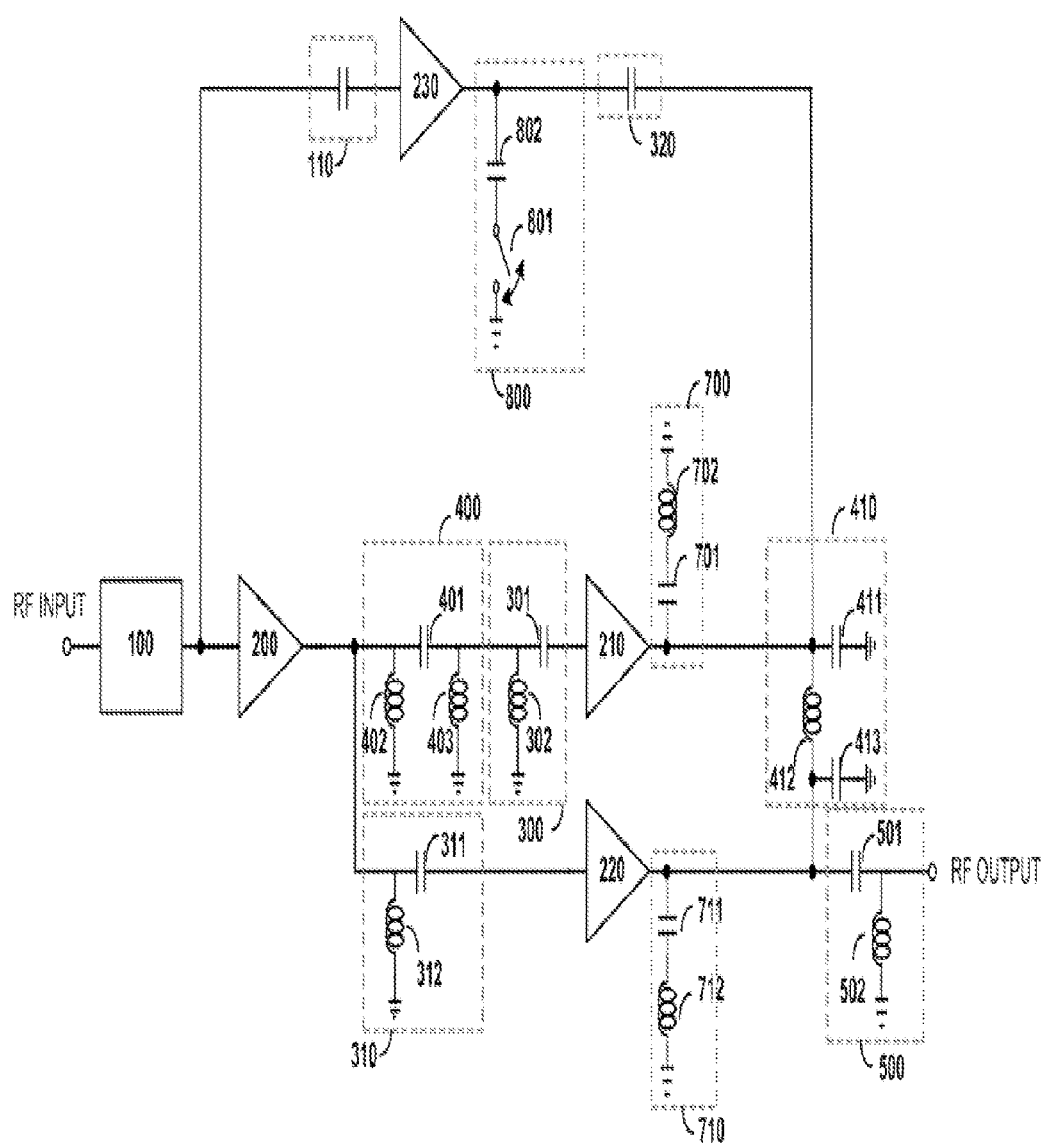
FIG. 14 illustrates a specific embodiment of the multi-mode Doherty power amplifier using a switching capacitor unit in accordance with the embodiment of the present invention.

FIG. 14 illustrates a specific embodiment of the multi-mode Doherty power amplifier using a switching capacitor unit in accordance with the embodiment of the present invention. In the first power mode, a signal amplified by the first power stage 200 is amplified once more by the second or third power stage 210 and 220. In the second power mode, a signal is amplified only by the fourth power stage 230.

Figure 15:
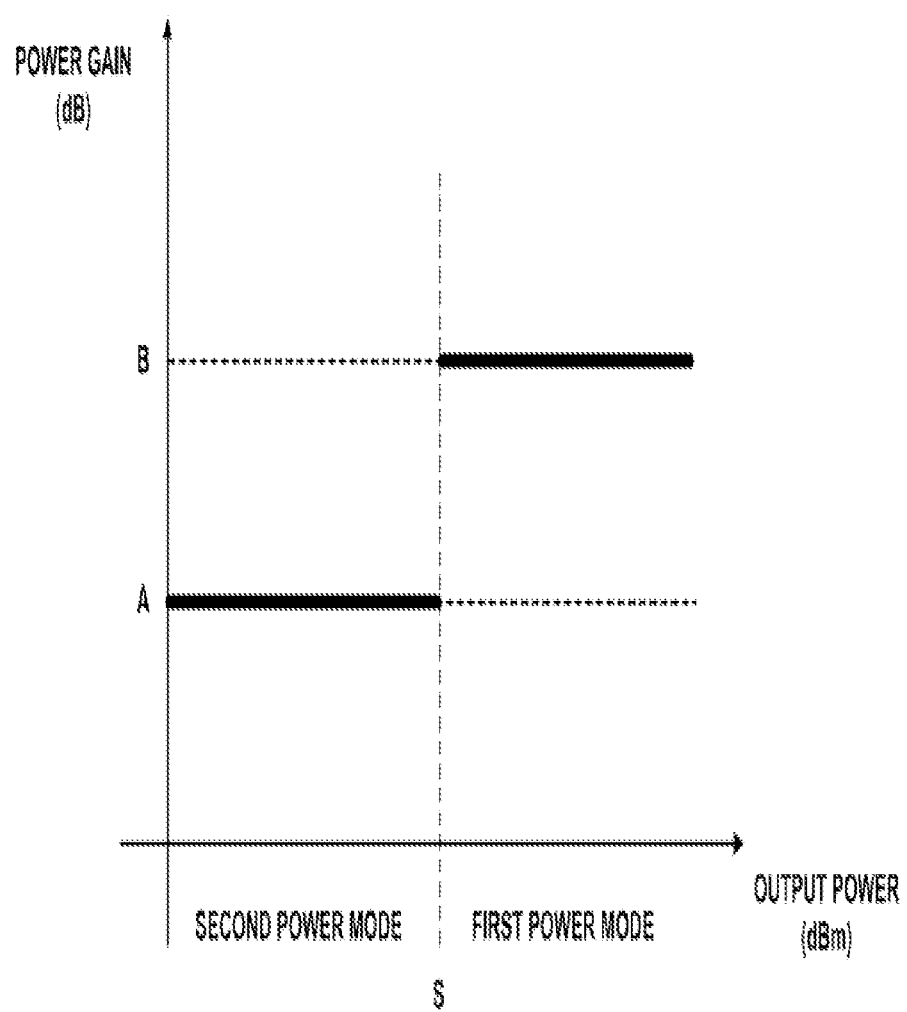
FIG. 15 is a power gain characteristic graph of the multi-mode Doherty power amplifier in accordance with the embodiment of the present invention, during the first and second power modes.

FIG. 15 is a power gain characteristic graph of the multi-mode Doherty power amplifier in accordance with the embodiment of the present invention, during the first and second power modes. Referring to FIG. 15, a power gain in the first power mode is higher than a power gain in the second power mode.

Figure 16:
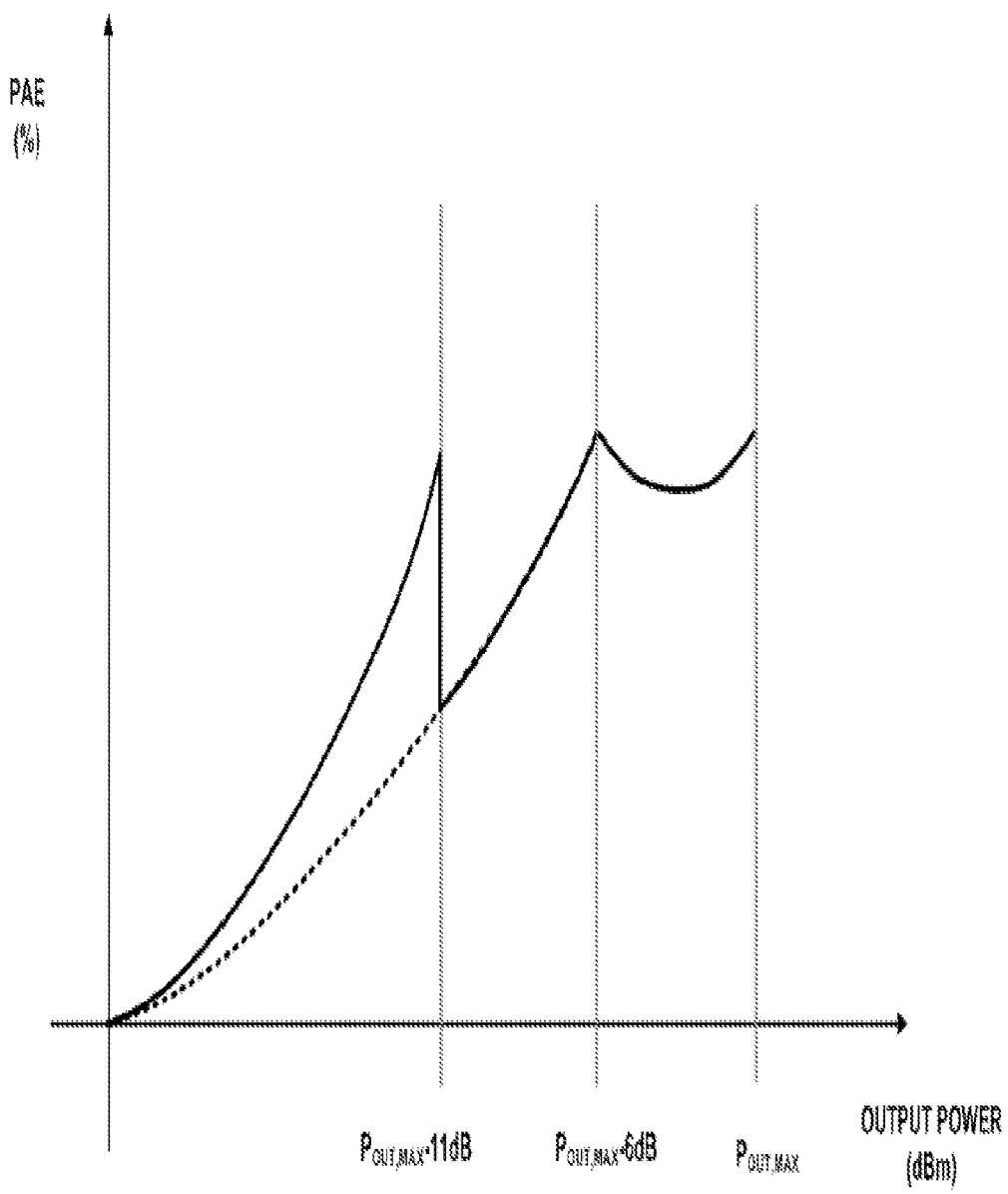
FIG. 16 is an ideal power added efficiency graph of the multi-mode Doherty power amplifier in accordance with the embodiment of the present invention, during the first and second power modes.

FIG. 16 is an ideal power added efficiency graph of the multi-mode Doherty power amplifier in accordance with the embodiment of the present invention, during the first and second power modes. Referring to FIG. 16, a backoff power point at which the maximum output power is accomplished in the second power mode and relatively high power added efficiency is obtained during the Doherty operation may be controlled according to the purpose of the power amplifier.

In this embodiment of the present invention, two parallel inductors and one capacitor are used to construct a π-network.

Figure 17:
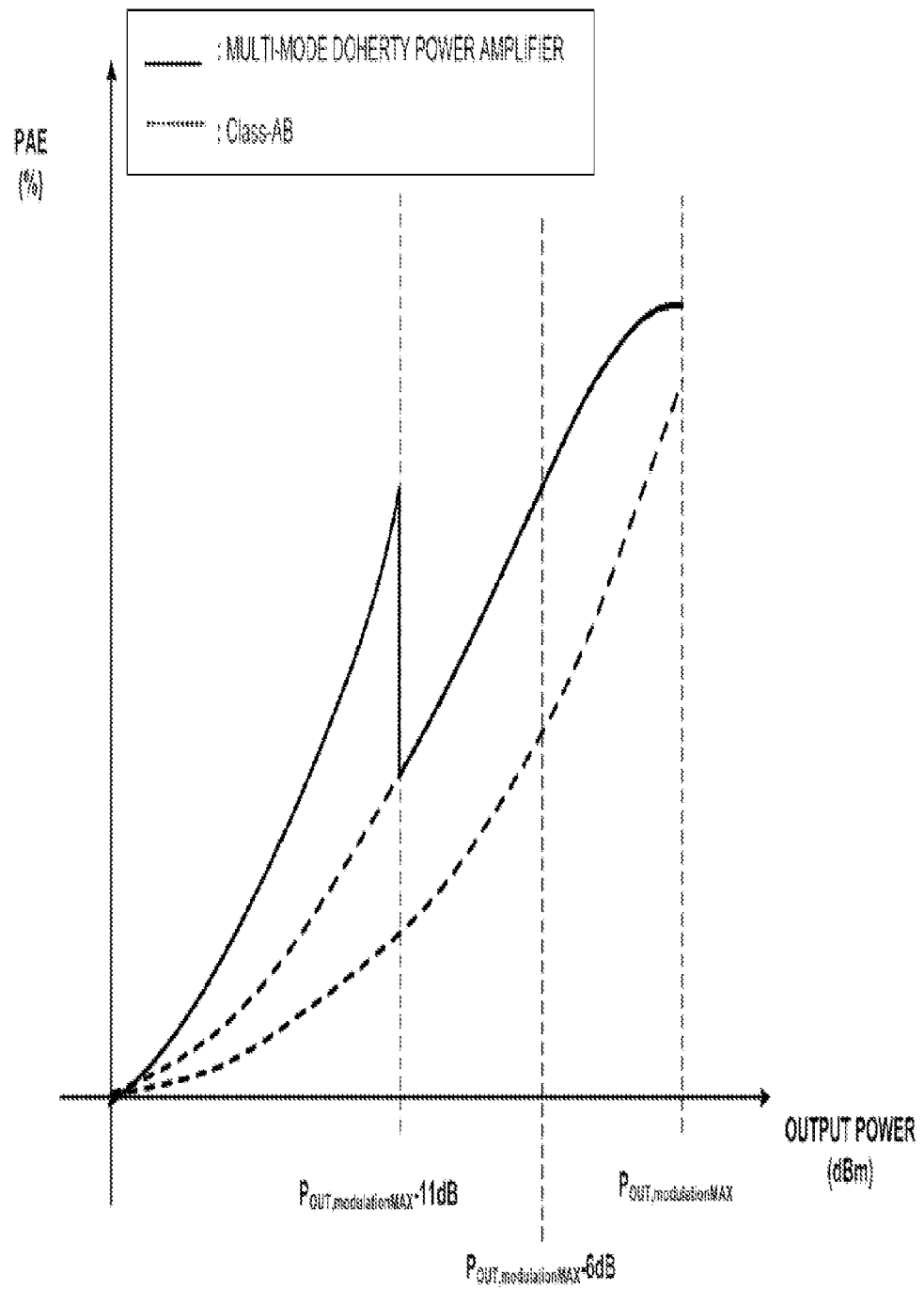
FIG. 17 is a power added efficiency graph of the multi-mode Doherty power amplifier in accordance with the embodiment of the present invention when a modulated signal is applied to the multi-mode Doherty power amplifier.

FIG. 17 is a power added efficiency graph of the multi-mode Doherty power amplifier in accordance with the embodiment of the present invention when a modulated signal is applied to the multi-mode Doherty power amplifier.

Figure 18:
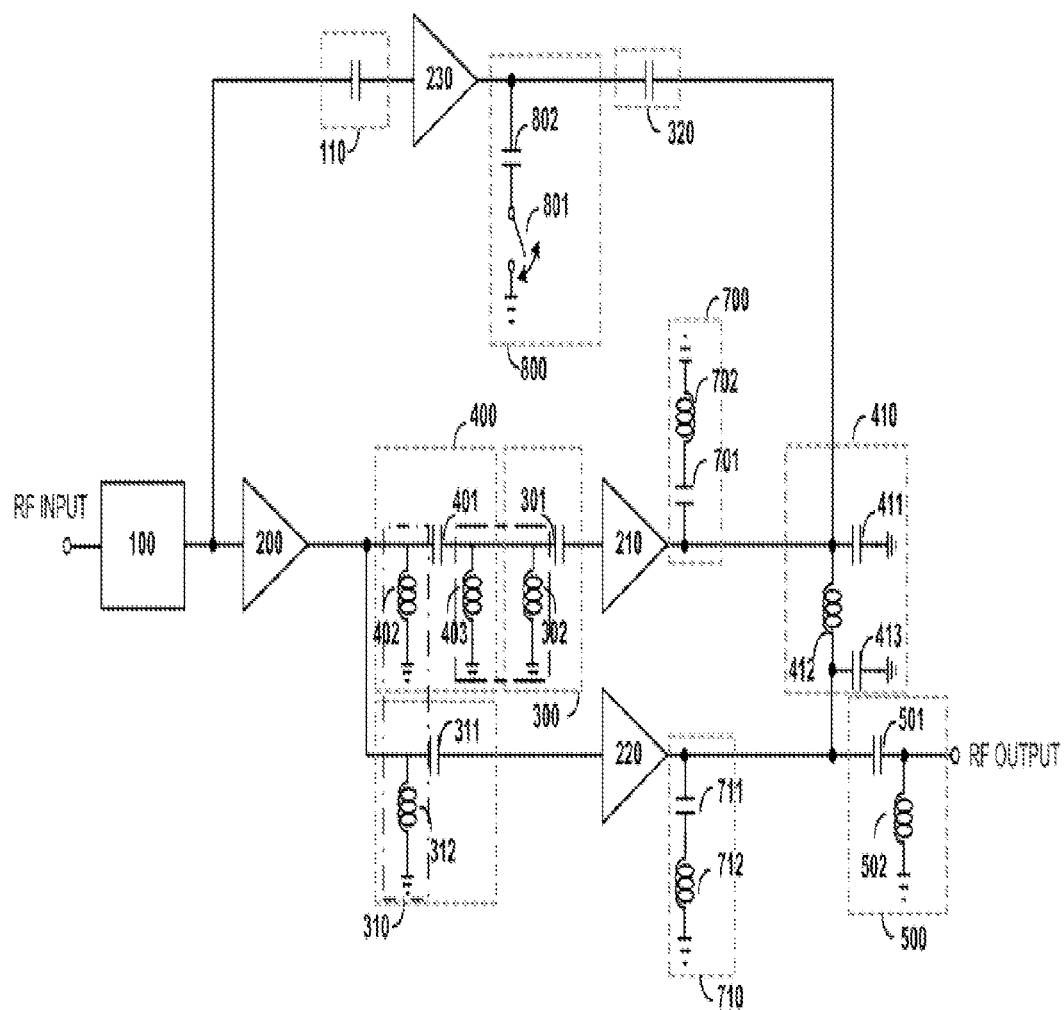
FIG. 18 illustrates an embodiment including inductors positioned at the same node in the multi-mode Doherty power amplifier in accordance with the embodiment of the present invention.

FIG. 18 illustrates an embodiment including inductors positioned at the same node in the multi-mode Doherty power amplifier in accordance with the embodiment of the present invention. Referring to FIG. 18, a third inductor 402 positioned at the front inside the first λ/4 impedance control circuit 400 and a second inductor 312 of the second impedance matching unit 310 are positioned at one node, and may be combined as a first combined inductor 910.

Furthermore, a fourth inductor 403 positioned at the rear inside the first λ/4 impedance control circuit 400 and a first inductor 302 of the first impedance matching unit 300 may be combined as a second combined inductor 920. The inductors at the same node may be combined with each other, and the sum of parallel inductances has a characteristic that the magnitude thereof decreases. Therefore, the size of the inductors may be reduced.

The first combined inductor 910 in the first λ/4 impedance control circuit 400 and the second impedance matching unit 310 may be combined with an inductor of the bias line connected to the collector of the first power stage 200. Accordingly, an inductor having a small size may be used to form this circuit configuration.

Figure 19:
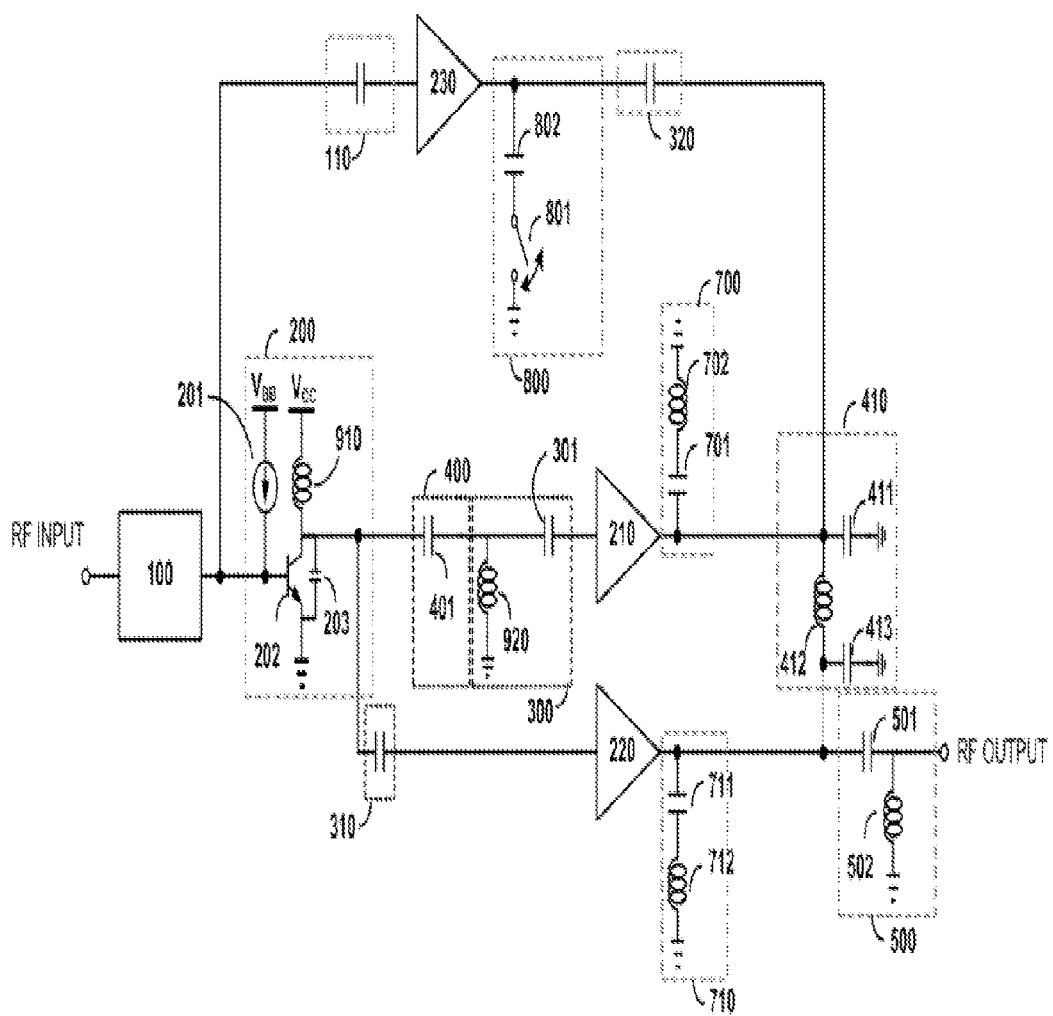
FIG. 19 illustrates another embodiment in which inductors are combined in the multi-mode Doherty power amplifier in accordance with the embodiment of the present invention.

FIG. 19 illustrates another embodiment in which inductors are combined in the multi-mode Doherty power amplifier in accordance with the embodiment of the present invention.

In this embodiment of the present invention, an offset line behind the third power stage 220 is removed, and a delay circuit before the third power stage 220 is not added. Therefore, the number of elements used therein may be reduced. Accordingly, an integrated circuit having a small size may be easily implemented.

Furthermore, components having inductance may be combined to implement inductors having a small size.

In accordance with the embodiment of the present invention, the multi-mode Doherty power amplifier is a multi-mode Doherty power amplifier operating in the first and second power modes. During the first power mode corresponding to a high power period, the multi-mode Doherty power amplifier may obtain relatively high efficiency through the Doherty characteristic. Furthermore, during the second power mode corresponding to a low power period, the multi-mode Doherty power amplifier may also obtain relatively high efficiency. The multi-mode Doherty power amplifier uses a switch connected in parallel instead of a serial switch used in the conventional power amplifier. Furthermore, the multi-mode Doherty power amplifier prevents a signal from being transmitted through a path where the switch is positioned, thereby removing a loss caused by the switch. The inductance components of the π-network and the impedance matching unit may be combined to reduce the number of elements and the size of inductors. An offset line and a delay circuit may be removed to reduce the number of elements and easily implement an integrated circuit having a small size.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A multi-mode Doherty power amplifier comprising:
a first input impedance matching unit configured to receive an input voltage through one side thereof;
a first power stage having one side connected to an output terminal of the first input impedance matching unit;
a first λ/4 impedance control circuit having one side connected to an output terminal of the first power stage;
a first impedance matching unit having one side connected to an output terminal of the first λ/4 impedance control circuit;
a second power stage having one side connected to an output terminal of the first impedance matching unit;
a first harmonic control unit having one side connected to an output terminal of the second power stage;
a second λ/4 impedance control circuit commonly connected to the output terminal of the second power stage;
a second impedance matching unit commonly connected to the output terminal of the first power stage;
a third power stage having one side connected to an output terminal of the second impedance matching unit;
a second harmonic control unit having one side connected to an output terminal of the third stage;
a second input impedance matching unit commonly connected to the output terminal of the first input impedance matching unit;

a fourth power stage having one side connected to an output terminal of the second input impedance matching unit;

a switching capacitor unit having one side connected to an output terminal of the fourth power stage and the other side connected to a ground voltage;

a third impedance matching unit having one side commonly connected to the output terminal of the fourth power stage and the other side commonly connected to the output terminal of the second power stage;

a first output impedance matching unit having one side commonly connected to the output terminals of the second $\lambda/4$ impedance control circuit and the third power stage; and a voltage control circuit having control lines connected to the other sides of the first to fourth power stages, respectively, wherein the first output impedance matching unit is configured to transmit an output signal through the other side thereof.

2. The multi-mode Doherty power amplifier of claim 1, wherein an operation region is divided into first to third operation regions depending on change of the input voltage, the first operation region is where only the first input impedance matching unit, the first power stage, the first $\lambda/4$ impedance control circuit, the first impedance matching unit, the second power stage, the second $\lambda/4$ impedance control circuit, the switching capacitor unit, and the first output impedance matching unit are operated, the second operation region is where the first input impedance matching unit, the first power stage, the second impedance matching unit, and the third power stage are operated in addition to the first operation region, the third operation region is where the first input impedance matching unit, the second input impedance matching unit, the fourth power stage, the switching capacitor unit, the third impedance matching unit, the second $\lambda/4$ impedance control circuit, and the first output impedance matching unit are operated, a first power mode corresponds to a mode in which the components operating in the first and second operation regions are operated, and a second power mode corresponds to a mode in which the components operating in the third operation region are operated.

3. The multi-mode Doherty power amplifier of claim 2, wherein the first operation region is performed when the magnitude of the input voltage is larger than the magnitude of an input voltage at which the third operation region is performed, and the second operation region is performed when the magnitude of the input voltage is larger than the magnitude of the input voltage at which the first operation region is performed.

4. The multi-mode Doherty power amplifier of claim 2, wherein the voltage control circuit unit controls application of voltages required for the first operation region, the second operation region, and the third operation region.

5. The multi-mode Doherty power amplifier of claim 2, wherein during the first power mode, the second and third power stages connected in parallel cause a Doherty operation.

6. The multi-mode Doherty power amplifier of claim 2, wherein the switching capacitor unit comprises a tenth capacitor having one side connected to a connection line between the fourth power stage; and a first switch having one side connected to the other side of the tenth capacitor and the other side connected to a ground voltage, during the first power mode, the switching capacitor unit prevents output of the circuit operating in first power mode from being transmitted to the fourth power stage, transmits output power to the first output impedance matching unit without a loss, and increases impedance in the direction of the output terminal of the fourth power stage from the second power stage to a larger value than existing impedance, and the first switch connects the tenth capacitor and the ground voltage, and during the second power mode, the switching capacitor unit prevents output of the circuit operating in the second power mode from being lost, and the first switch disconnects the tenth capacitor from the ground voltage.

7. The multi-mode Doherty power amplifier of claim 2, wherein during the second power mode, the first power stage prevents an output signal of the first input impedance matching unit from being inputted to the circuits operating in the first power mode so as to minimize a loss, the second power stage prevents output of the third power stage operating in the second operation region from being lost, prevents output of the third impedance matching unit operating in the third operation region from being lost, and increases impedance in the direction of the output terminal of the second power stage from the second $\lambda/4$ impedance control circuit to a larger value than existing impedance, and the third power stage prevents output of the second power stage operating in the first operation region from being lost, prevents output of the third impedance matching unit operating in the third operation region from being lost, and increases impedance in the direction of the output terminal of the third power stage from the first output impedance matching unit to a larger value than existing impedance.

8. The multi-mode Doherty power amplifier of claim 2, wherein during the first power mode, the fourth power stage prevents an output signal of the first input impedance matching unit from being inputted to the circuits operating in the second power mode so as to minimize a loss, and increases impedance in the direction of the output terminal of the fourth power stage from the first output impedance matching unit to a larger value than existing impedance.

9. The multi-mode Doherty power amplifier of claim 8, wherein the first $\lambda/4$ impedance control circuit comprises:

a fourth capacitor connected to the output terminal of the first power stage and having one side connected to the first impedance matching unit;

a third inductor commonly connected to a connection line between the first power stage and the fourth capacitor; and a fourth inductor commonly connected to a connection line between the fourth capacitor and the first impedance matching unit, the third inductor, the fourth inductor, and the fourth capacitor construct a $\pi$-network, the other sides of the third and fourth inductors are connected to the ground voltage, and the third and fourth inductors comprise micro strip lines or bonding wires, $\lambda/4$ transform an input signal, and adjust a delay time between the second and third power stages.

10. The multi-mode Doherty power amplifier of claim 9, wherein the second λ/4 impedance control circuit comprises:
- a fifth inductor connected to the output terminal of the second power stage and having one side connected to the first output impedance matching unit;
- a fifth capacitor commonly connected to a connection line between the second power stage and the fifth inductor; and
- a sixth capacitor commonly connected to a connection line between the fifth inductor and the first output impedance matching unit,
- the other sides of the fifth and sixth capacitors are connected to a ground voltage, and
- the fifth inductor comprises a micro strip line or bonding wire, λ/4 transforms an input signal, and controls load line impedance of the second power stage.

11. The multi-mode Doherty power amplifier of claim 10, wherein the first impedance matching unit comprises:
- a capacitor having one side connected to the output terminal of the first λ/4 impedance control circuit and the other side connected to the second power stage; and
- a first inductor commonly connected to a connection line between the first λ/4 impedance control circuit and the second capacitor,
- the second impedance matching unit comprises:
- a third capacitor having the other side connected to the third power stage; and
- a second inductor having one side connected to a connection line between the first power stage and the third capacitor and the other side connected to a ground voltage, wherein the one side of the second inductor is connected to the output terminal of the first power stage, and
- the third impedance matching unit performs an impedance matching function to prevent output signals of the circuits operating in the first power mode from being transmitted to the fourth power stage during the first power mode, and to receive output power of the fourth power stage and transmit the output power to the second λ/4 impedance control circuit without a loss during the second power mode.

12. The multi-mode Doherty power amplifier of claim 2, wherein the second input impedance matching unit performs an impedance matching function to minimize a signal loss in the direction of the third operation region from the first and second operation regions.

13. The multi-mode Doherty power amplifier of claim 2, wherein the first output impedance matching unit transmits output of the circuit operating in the first power mode as the maximum output signal during the first power mode, and transmits output of the circuit operating in the second power mode as the maximum output signal during the second power mode.

14. The multi-mode Doherty power amplifier of claim 2, wherein the first harmonic control unit is commonly connected to a connection line between the output terminal of the second power stage and the second λ/4 impedance control circuit and increases impedance in the direction of an output terminal of the second power stage to a larger value than existing impedance, and
- the second harmonic control unit is commonly connected to a connection line between the output terminal of the third power stage and the first output matching circuit and increases impedance in the direction of the output terminal of the third power stage to a larger value than existing impedance.

15. The multi-mode Doherty power amplifier of claim 11, further comprising an inductance component having one side commonly connected to the output terminal of the first power stage and the other side connected to power,
- wherein the inductance component, the third inductor, and the second inductor are combined and used as a first combined inductor,
- the fourth inductor and the first inductor are combined and used as a second combined inductor, and
- the first combined inductor and the second combined inductor comprise a micro strip line or bonding wire.

16. A multi-mode Doherty power amplifier comprising only four amplification units, the four amplification units comprising:
- a first amplification unit configured to amplify an input signal;
- second and third amplification units connected in parallel to the first amplification unit; and
- a fourth amplification unit connected in parallel to the first amplification with respect to the input signal,
- wherein the first to fourth amplification units are operated in multiple modes divided into first and second power modes, depending on change of the input signal, wherein the first, second and third amplification units are operated in the first power mode and only the fourth amplification unit is operated in the second power mode.

17. The multi-mode Doherty power amplifier of claim 16, wherein the first power mode comprises:
- a first operation region in which the first and second amplification units are operated; and
- a second operation region in which the third amplification unit is operated in addition to the components operating in the first operation region, and
- the second power mode comprises a third operation region in which application of a voltage required for operating only the fourth amplification unit is controlled.

18. The multi-mode Doherty power amplifier of claim 17, wherein the first operation region is performed when the magnitude of the input voltage is larger than the magnitude of an input voltage by which the third operation region is performed, and
- the second operation region is performed when the magnitude of the input voltage is larger than the magnitude of the input voltage by which the first operation region is performed.

19. The multi-mode Doherty power amplifier of claim 16, further comprising a voltage control circuit unit configured to control application of voltages inputted to the first to fourth amplification units.

20. The multi-mode Doherty power amplifier of claim 16, wherein the second and third amplification units cause a Doherty operation.

* * * * *